United States Patent
Wang et al.

(10) Patent No.: US 10,461,122 B2
(45) Date of Patent: Oct. 29, 2019

(54) LIGHT EMITTING DIODE DISPLAY PANEL AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanfeng Wang, Beijing (CN); Xiaoling Xu, Beijing (CN); Yuanxin Du, Beijing (CN); Zhenhua Lv, Beijing (CN); Yun Qiu, Beijing (CN); Dan Wang, Beijing (CN); Xue Dong, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/759,633

(22) PCT Filed: Aug. 18, 2017

(86) PCT No.: PCT/CN2017/098041
§ 371 (c)(1),
(2) Date: Mar. 13, 2018

(87) PCT Pub. No.: WO2018/126697
PCT Pub. Date: Jul. 12, 2018

(65) Prior Publication Data
US 2019/0051696 A1 Feb. 14, 2019

(30) Foreign Application Priority Data
Jan. 4, 2017 (CN) .......................... 2017 1 0004513

(51) Int. Cl.
H01L 27/15 (2006.01)
G02B 5/30 (2006.01)
(Continued)

(52) U.S. Cl.
CPC .............. *H01L 27/156* (2013.01); *G02B 5/30* (2013.01); *G02B 5/3083* (2013.01); *G02B 27/26* (2013.01);
(Continued)

(58) Field of Classification Search
CPC . H01L 27/153; H01L 27/156; H01L 25/0576; H01L 27/1296; H01L 27/1259;
(Continued)

(56) References Cited

U.S. PATENT DOCUMENTS

2013/0188023 A1  7/2013  Kuang et al.
2016/0056215 A1* 2/2016  Choi ................. G02B 5/3016
                                                  257/40
2016/0249045 A1  8/2016  Xu

FOREIGN PATENT DOCUMENTS

CN    101752472 A    6/2010
CN    201622392 U   11/2010
(Continued)

OTHER PUBLICATIONS

International Search Report and Written Opinion dated Dec. 4, 2017, PCT/CN2017/098041.
(Continued)

*Primary Examiner* — Thanhha S Pham

(57) ABSTRACT

A light emitting diode display panel and a manufacturing method thereof, and a display device. The light emitting diode display panel includes a substrate, a plurality of light emitting diodes arranged in an array on the substrate; a plurality of polarization layers located on a light exit side of the plurality of light emitting diodes respectively, and the (Continued)

plurality of polarization layers are in a one-to-one correspondence to the plurality of light emitting diodes; the plurality of polarization layers include a plurality of first polarization layers and a plurality of second polarization layers having different polarization directions.

16 Claims, 3 Drawing Sheets

(51) Int. Cl.
    *G09G 3/00*     (2006.01)
    *H01L 27/12*     (2006.01)
    *G02B 27/26*     (2006.01)
    *G09G 3/20*     (2006.01)
    *H01L 33/36*     (2010.01)
    *H01L 25/075*     (2006.01)
    *H01L 33/44*     (2010.01)
    *G09G 3/32*     (2016.01)
    *G02B 5/18*     (2006.01)
    *H01L 33/58*     (2010.01)

(52) U.S. Cl.
    CPC .......... *G09G 3/003* (2013.01); *G09G 3/2003* (2013.01); *H01L 25/0753* (2013.01); *H01L 27/1259* (2013.01); *H01L 27/1296* (2013.01); *H01L 27/153* (2013.01); *H01L 33/36* (2013.01); *H01L 33/44* (2013.01); *G02B 5/1809* (2013.01); *G09G 3/32* (2013.01); *H01L 33/58* (2013.01)

(58) Field of Classification Search
    CPC ......... H01L 33/36; H01L 33/44; G02B 27/22; G02B 27/26; G01B 5/30; G09G 3/003
    See application file for complete search history.

(56) References Cited

FOREIGN PATENT DOCUMENTS

| | | |
|---|---|---|
| CN | 201654268 U | 11/2010 |
| CN | 104038754 B | 8/2016 |
| CN | 105933696 A | 9/2016 |
| CN | 106684109 A | 5/2017 |
| KR | 1020140055532 A | 5/2014 |

OTHER PUBLICATIONS

The First Chinese Office Action dated Jan. 18, 2019; Appln. 201710004513.3.

* cited by examiner

1

LIGHT EMITTING DIODE DISPLAY PANEL AND MANUFACTURING METHOD THEREOF, AND DISPLAY DEVICE

The present application claims priority of China Patent application No. 201710004513.3 filed on Jan. 4, 2017, the content of which is incorporated in its entirety as portion of the present application by reference herein.

TECHNICAL FIELD

At least one embodiment of the present disclosure relates to a light emitting diode display panel and a manufacturing method thereof, and a display device.

BACKGROUND

A light emitting diode (LED) is a light emitting semiconductor electronic component with characteristics of small size, high brightness, and low energy consumption, the light emitting diode is widely used in some fields such as display screen, backlight, lighting and three dimensional (3D) display.

Currently, the 3D display technology is getting more and more attention, the 3D display technology is capable of making the image become stereoscopic and vivid. The principle of the 3D display technology is to use the left and right eyes of the human eyes to accept different images respectively, and reconstruct the image of the stereoscopic display effect after the image information is regenerated through the brain.

SUMMARY

At least one embodiment of the present disclosure provides a light emitting diode display panel and a manufacturing method thereof, and a display device.

At least one embodiment of the present disclosure provides a light emitting diode display panel, the light emitting diode display panel includes a substrate; a plurality of light emitting diodes arranged in an array on the substrate; a plurality of polarization layers located on a light exit side of the plurality of light emitting diodes respectively, and the plurality of polarization layers are in a one-to-one correspondence to the plurality of light emitting diodes; and the plurality of polarization layers include a plurality of first polarization layers and a plurality of second polarization layers having different polarization directions.

For example, the plurality of first polarization layers and the plurality of second polarization layers are linear polarization layers, and the polarization direction of the plurality of first polarization layers is perpendicular to that of the plurality of the second polarization layers.

For example, the plurality of first polarization layers and the plurality of second polarization layers are circular polarization layers, and a rotation of the plurality of first polarization layers is opposite to that of the plurality of second polarization layers.

For example, the plurality of polarization layers on the light exit side of the plurality of light emitting diodes arranged in a first direction has the same polarization direction, the plurality of first polarization layers and the plurality of second polarization layers on the light exit side of the plurality of light emitting diodes arranged in a second direction perpendicular to the first direction are alternately arranged.

For example, each of the plurality of first polarization layers and each of the plurality of second polarization layers are respectively located on the light exit side of every two adjacent light emitting diodes of the plurality of light emitting diodes.

For example, each of the plurality of light emitting diodes includes a first electrode, the first electrode is located on the light exit side of each of the plurality of light emitting diodes, and the first electrode and each of the plurality of polarization layers are located on the same layer.

For example, an orthogonal projection of an light exit area of the plurality of light emitting diodes on the substrate falls within an orthogonal projection of the plurality of polarization layers on the substrate, and the orthogonal projection of the plurality of polarization layers on the substrate falls within an orthogonal projection of the plurality of light emitting diodes on the substrate.

For example, every two adjacent light emitting diodes of the plurality of light emitting diodes are spaced apart.

For example, the plurality of light emitting diodes include a plurality of light emitting diode groups, each of the plurality of light emitting diode groups includes at least two light emitting diodes of different colors, and the polarization layers located on the light exit side of the light emitting diodes in each of the plurality of light emitting diode groups are have the same polarization direction.

For example, each of the plurality of light emitting diodes has a size of about 1 μm to 100 μm.

For example, the plurality of polarization layers are provided with nano-sized grating patterns.

At least one embodiment of the present disclosure provides a manufacturing method of a light emitting diode display panel, which includes forming a plurality of light emitting diodes arranged in an array on a substrate; forming a plurality of polarization layers on a light exit side of the plurality of light emitting diodes, and the plurality of polarization layers are in a one-to-one correspondence to the plurality of light emitting diodes, and the plurality of polarization layers include a plurality of first polarization layers and a plurality of second polarization layers having different polarization directions.

For example, forming the plurality of light emitting diodes including: forming a first electrode on the light exit side of each of the plurality of light emitting diodes.

For example, forming the plurality of light emitting diodes arranged in an array on the substrate including: transferring the plurality of light emitting diodes onto the substrate by a transferring method; forming the plurality of polarization layers on the light exit side of the plurality light emitting diodes including: after transferring the plurality of light emitting diodes onto the substrate, forming the plurality of polarization layers on a same layer as the layer of the first electrode.

For example, an orthogonal projection of light exit area of the plurality of light emitting diodes on the substrate falls within an orthogonal projection of the plurality of polarization layers on the substrate, and the orthogonal projection of the plurality of polarization layers on the substrate falls within an orthogonal projection of the plurality of light emitting diodes on the substrate.

At least one embodiment of the present disclosure provides a display device, which includes the light emitting diode display panel as mentioned above.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
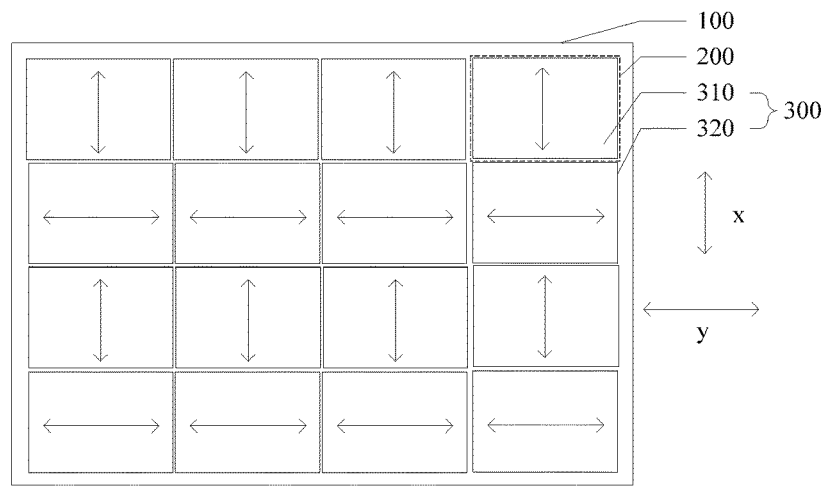
FIG. 1 is a view of a light emitting diode display panel provided by an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "includes," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On", "under", "left", "right" and the like are only used to indicate relative position relationship, and when the position of the object which is described is changed, the relative position relationship may be changed accordingly.

At least one embodiment of the present disclosure provides a light emitting diode display panel and a manufacturing method thereof, and a display device. The light emitting diode display panel includes a substrate, a plurality of light emitting diodes arranged in an array on the substrate; a plurality of polarization layers located on a light exit side of the plurality of light emitting diodes respectively, and the plurality of polarization layers are in a one-to-one correspondence to the plurality of light emitting diodes, and the plurality of polarization layers include a plurality of first polarization layers and a plurality of second polarization layers having different polarization directions. The light emitting diode display panel can form different polarization display images in a line-by-line/column-by-column or a one-by-one manner, and the left and right eyes of the human eye can see different images in a case that the polarization display image light passes through the corresponding polarization glasses, thereby realizing a monochrome or colored 3D display effect. The light emitting diode display panel can be used to solve 3D crosstalk and other problems so as to enhance the 3D experience effect.

Hereinafter, the light emitting diode display panel and the manufacturing method thereof and the display device provided in embodiments of the present disclosure will be described below with reference to the accompanying drawings.

First Embodiment

The present embodiment provides a light emitting diode display panel, as illustrated in FIG. 1, the light emitting diode display panel includes: a substrate 100, a plurality of light emitting diodes 200 arranged in an array on the substrate 100; a plurality of polarization layers 300 located on a light exit side of the plurality of light emitting diodes 200, and the plurality of light emitting diodes 200 are in a one-to-one correspondence to the plurality of polarization layers 300, that is, the light exit side of each of the plurality of light emitting diodes 200 is provided with one of the plurality of polarization layers 300. As illustrated in FIG. 1, a dashed line box circles one of the plurality of light emitting diodes 200, the present embodiment is described by taking a case that the light exit side of the light emitting diodes 200 is a side thereof away from the substrate 100, the plurality of polarization layers 300 are located on the light exit side of the plurality of light emitting diodes 200, that is, the plurality of polarization layers 300 are located on the side of the plurality of light emitting diodes 200 away from the substrate 100, but is not limited thereto. For example, the light exit side of the light emitting diodes 200 may also be located on a side thereof face to the substrate 100, the plurality of polarization layers 300 are located on the light exit side of the plurality of light emitting diodes 200, that is, the plurality of polarization layers 300 are located between the plurality of light emitting diodes 200 and the substrate 100.

In the present embodiment, the plurality of polarization layers 300 include a plurality of first polarization layers 310 and a plurality of second polarization layers 320 having different polarization directions. For example, the present embodiment is described by taking an example that the plurality of first polarization layers 310 and the plurality of second polarization layers 320 are linear polarization layers, that is, the present embodiment is described by taking an example that the polarization direction of the plurality of first polarization layers 310 is perpendicular to the polarization direction of the plurality of second polarization layers 320, hereinafter, the "perpendicular" includes strictly perpendicular and approximately perpendicular. As illustrated in FIG. 1, the present embodiment is described by taking an example that a light transmitting direction of the plurality of first polarization layers 310 is along x direction, a light transmitting direction of the plurality of second polarization layers 320 is along y direction, but is not limited thereto. The light emitted by the plurality of light emitting diodes 200 is irradiated onto the plurality of first polarization layers 310 located on the light exit side, the plurality of first polarization layers 310 absorb the light with a polarization direction perpendicular to the x direction, therefore, the light transmitted from the plurality of first polarization layers 310 is the linear polarization light having the same polarization direction as the x direction; similarly, the light emitted by the plurality of light emitting diodes 200 is irradiated onto the plurality of second polarization layers 320 located on the light exit side, the light transmitted from the plurality of second polarization layers 320 is the linear polarization light having the same polarization direction as the y direction. The present embodiment is not limited thereto, the plurality of first polarization layers 310 and the plurality of second polarization layers 320 may also include circular polarization layers, for example, in a case that the plurality of first polarization layers 310 and the plurality of second polarization layers 320 are circular polarization layers, a rotation of the plurality of first polarization layers 310 is opposite to the plurality of second polarization layers 320. Therefore, the polarization light having different image information transmitted from the plurality of first polarization layers and the plurality of second polarization layers 320 may enter the left and right eyes of the human eyes through the corresponding polarization glasses and realize three dimensional (3D) display effect. Generally, a monolithic polarization plate on a light exit side of a display panel easily transmits the light emitted by light emitting diodes in the display panel to a polarization area corresponding to the adjacent light emitting diodes to cause crosstalk. The plurality of polarization layers 300 are located on the light exit side of the plurality of light emitting diodes 200 respectively, and the plurality of polarization layers 300 corresponding to the plurality of light emitting diodes 200 one by one to solve the 3D crosstalk problems or the like and improve the 3D experience effect.

For example, as illustrated in FIG. 1, the plurality of polarization layers 300 on the light exit side of the plurality of light emitting diodes 200 arranged in a first direction have the same polarization direction, the plurality of first polarization layers 310 and the plurality of second polarization layers 320 on the light exit side of the plurality of light emitting diodes 200 arranged in a second direction perpendicular to the first direction are alternately arranged. It should be noted that, the first direction in the present embodiment refers to the y direction in FIG. 1, the second direction refers to the x direction, but the present embodiment is not limited thereto. It may also be that the plurality of polarization layers 300 on the light exit side of the plurality of light emitting diodes 200 arranged in the x direction have the same polarization direction, the plurality of first polarization layers 310 and the plurality of second polarization layers 320 on the light exit side of the plurality of light emitting diodes 200 arranged in the y direction are alternately arranged. For example, a driving device is disposed at the periphery of the light emitting diode display panel for driving the plurality of light emitting diodes 200 to emit light. For example, the driving device drives the plurality of light emitting diodes 200 with the plurality of first polarization layers 310 on the light exit side to display a left (right) eye viewing image, and drives the plurality of light emitting diodes 200 with the plurality of second polarization layers 320 on the light exit side to display right (left) eye viewing image, because the plurality of first polarization layers 310 and plurality of the second polarization layers 320 on the light exit side of the plurality of light emitting diodes 200 arranged in the x (y) direction are alternately arranged, the light emitting diode display panel can form different polarization display images in a line-by-line or a column-by-column manner, and the left and right eyes of the human eyes can see different images in a case that the polarization display image light passes through the corresponding polarization glasses, thereby realizing the 3D display effect.

Figure 2:
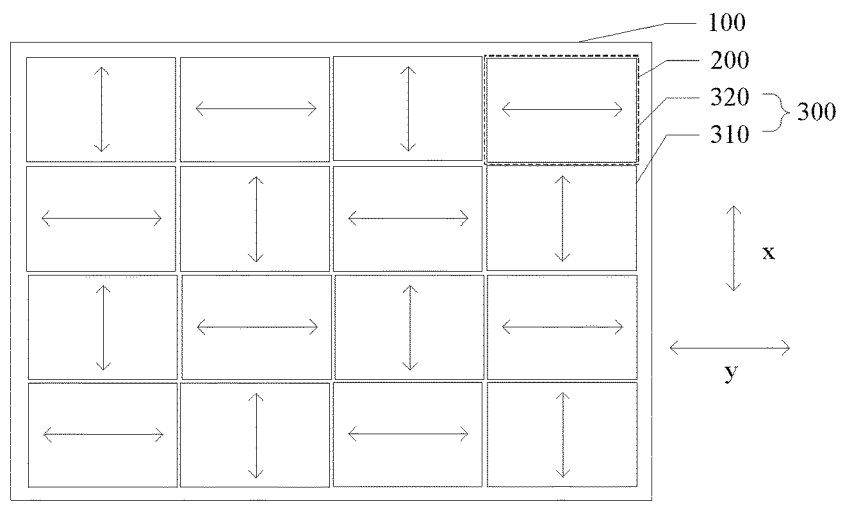
FIG. 2 is a view of another light emitting diode display panel provided by an embodiment of the present disclosure.

FIG. 2 is a view of another light emitting diode display panel provided by the present embodiment, as illustrated in FIG. 2, each of the plurality of first polarization layers 310 and each of the plurality of second polarization layers 320 are respectively located on the light exit side of two adjacent light emitting diodes 200 of the plurality of light emitting diodes 200, that is, the plurality of first polarization layers 310 and the plurality of second polarization layers 320 are alternately disposed on the light emitting side of the plurality of light emitting diodes 200 arranged in the x direction and the y direction. The driving device is configured to control the plurality of light emitting diodes 200 with the plurality of first polarization layers 310 and the plurality of second polarization layers 320 on the light emitting side to display two different images so as to realize that the human eyes can see different images in a case that the polarization images emitted from the plurality of first polarization layers 310 and the plurality of second polarization layers 320 through the corresponding polarization glasses so as to realize the 3D display effect. The light emitting diode display panel can be used to realize polarization display in a one-by-one manner to reduce the probability of crosstalk caused by the light emitted by each of the plurality of light emitting diodes 200 entering the corresponding polarization area of the adjacent light emitting diodes 200, and solve the 3D crosstalk and other problems, thereby improving the 3D experience effect.

For example, the driving device only control a part of the plurality of light emitting diodes 200 to emit light, that is, the driving device drives the plurality of light emitting diodes 200 with the plurality of first polarization layers 310 on the light exit side to emit light, and drives the plurality of light emitting diodes 200 with the plurality of second polarization layers 320 on the light exit side not to emit light, or the opposite, the driving device drives the plurality of light emitting diodes 200 with the plurality of second polarization layers 320 on the light exit side to emit light, and drives the plurality of light emitting diodes 200 with the plurality of first polarization layers 310 on the light exit side not to emit light, therefore, the displayed image information can be observed without polarization glasses so as to realize a 2D display effect. Therefore, the light emitting diode display panel provided by the present embodiment can realize a transition between the 2D display and the 3D display.

For example, according to different needs, the plurality of first polarization layers 310 and the plurality of second polarization layers 320 on the light exit side of the plurality of light emitting diodes 200 may also be arranged according to different arrangements, the present embodiment is not limited thereto.

It should be noted that, the monochromatic display is taken as an example in the present embodiment, each of the plurality of light emitting diodes 200 emits the light of the same color, for example, the same color is red, green or blue and so on, the present embodiment is not limited thereto.

Figure 3:
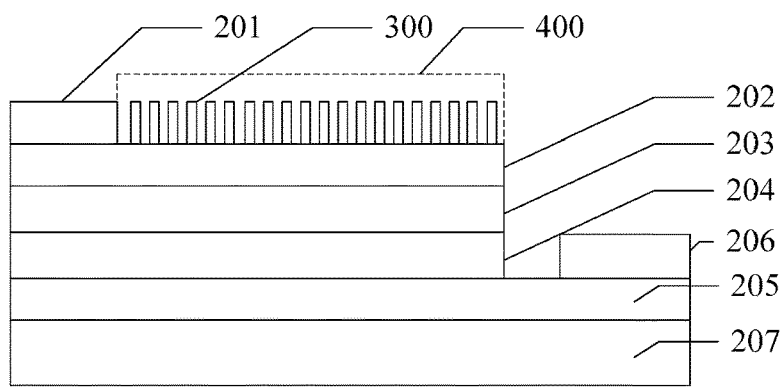
FIG. 3 is a structure view of a light emitting diode provided by an embodiment of the present disclosure.

FIG. 3 is a structure view of a light emitting diode provided by the present embodiment, as illustrated in FIG. 3, each of the plurality of light emitting diodes 200 includes a first electrode 201, a current spreading layer 202, a first semiconductor layer 203, a light emitting layer 204, a second semiconductor layer 205, a second electrode 206 and a base substrate 207, the present embodiment is not limited thereto.

For example, the present embodiment is described by taking a case that the first electrode 201 and the second electrode 206 are located on different layers, but the present embodiment is not limited thereto, the first electrode 201 and the second electrode 206 may also be located on the same layer.

For example, the present embodiment is described by taking a case that the first electrode 201 and the second electrode 206 are separately disposed on each of the plurality of light emitting diodes 200, but the present embodiment is not limited thereto, the plurality of light emitting diodes 200 may share anyone of the electrodes.

For example, a material of the base substrate 207 may be $Al_2O_3$, Si, GaAs, SiC, AlN, GaN, or the like, the present embodiment is not limited thereto.

For example, the light emitting layer 204 may be a single-layer quantum well (SQW) or a multi-layer quantum well (MQW) light emitting layer, that is, the structure of the light emitting layer 204 is a quantum well that can confine carriers, the present embodiment is not limited thereto, the light emitting layer 204 may also be a quantum dot light emitting layer. For example, a material of the light emitting layer of a red light emitting diode can be selected from one or more of AlGaAs, GaAsP, GaP; a material of the light emitting layer of a green light emitting diode can be selected from one or more of InGaN/GaN, GaP, AlGaP; a material of the light emitting layer of a blue light emitting diode can be selected from one or more of GaN, InGaN, ZnSe; a material of the light emitting layer of a yellow light emitting diode can be selected from one or more of GaAsP, GaP, ZnSe, InGaN, SiC; a material of the light emitting layer of an infrared light emitting diode can be selected from one or more of AlGaAs, GaAsP, AlGaInP, GaP; ZnO (GaP doped with ZnO), a material of the light emitting layer of an ultraviolet light emitting diode can be selected from one or more of AlN, AlGaN, the present embodiment is not limited thereto.

For example, a material of the first electrode 201 can be an opaque conductive material, and can be selected from one or more of Ti, Pt, Au, Cr, the present embodiment is not limited thereto. For example, a material of the first electrode 201 can also be a transparent conductive material, for example, the material can include a combination or at least one of ITO, IZO, ZnO, $In_2O_3$, IGO, the present embodiment is not limited thereto. A material of the second electrode 206 can be selected from one or more materials of Ti, Al, Ni, Pt, Au, the present embodiment is not limited thereto.

For example, the first semiconductor layer 203 can be a P-typed doped layer, the second semiconductor layer 205 can be an N-typed doped layer, the present embodiment is not limited thereto, it can also be that the first semiconductor layer 203 can be an N-typed doped layer, and the second semiconductor layer 205 can be a P-typed doped layer.

For example, as illustrated in FIG. 3, the current spreading layer 202 is a transparent conductive layer located on the first semiconductor layer 203, and can be used to uniformly disperse the current injected from the first electrode 201 and allow the current to flow through the entire first semiconductor layer 203, it should be noted that, the structure of each of the plurality of light emitting diodes 200 in the present embodiment can also not include the current spreading layer 202.

For example, the first electrode 201 is electrically connected to the first semiconductor layer 203, the second electrode 206 is electrically connected to the second semiconductor layer 205. For example, the first electrode 201 is a P electrode, the first semiconductor layer 203 is a P-typed semiconductor layer, the second electrode 206 is a N electrode, the second semiconductor layer 205 is a N-typed semiconductor layer, holes and electrons are respectively rejected into the second semiconductor layer 205 and the first semiconductor layer 203 from the second electrode 206 and the first electrode 201, and recombined in the light emitting layer 204 to release energy in a form of photons, the luminescence wavelength depends on the band gap of the luminescence material. The present embodiment is not limited thereto, it can also be that the first electrode 201 is an N electrode, the first semiconductor layer 203 is an N-type semiconductor layer, the second electrode 206 is a P electrode, and the second semiconductor layer 205 is a P-type semiconductor layer.

For example, the structure of each of the plurality of light emitting diodes 200 in the present embodiment is not limited thereto, and the structure can also include a current blocking layer, a middle barrier layer, a buffer layer and so on.

For example, as illustrated in FIG. 3, the first electrode 201 of each of the plurality of light emitting diodes 200 is located on the light exit side of each of the plurality of light emitting diodes 200, and each of the plurality of polarization layers 300 and the first electrode 201 are on the same layer. For example, the thickness of each of the plurality of polarization layers 300 is very thin, for example, the thickness is 50 Å-200 Å, it is not limited thereto. Through disposing the plurality of polarization layers 300 on the same layer as the first electrode 201, the polarization light can be emitted without an external polarization structure, so as to reduce the monolithic thickness and volume of the plurality of light emitting diodes 200 and optimize the performance.

It should be noted that, as illustrated in FIG. 3, the present embodiment is described by taking an example that the light exit side of the plurality of light emitting diodes 200 is located on a side thereof away from the base substrate 207, the first electrode 201 and each of the plurality of polarization layers 300 are disposed on the light exit side in the same layer, the present embodiment is not limited thereto.

For example, as illustrated in FIG. 3, an orthogonal projection of light exit area 400 of the plurality of light emitting diodes 200 on the base substrate 207 falls within an orthogonal projection of the plurality of polarization layers 300 on the base substrate 207, and the orthogonal projection of the plurality of polarization layers 300 on the base substrate 207 falls within an orthogonal projection of the plurality of light emitting diodes 200 on the base substrate 207. That is, the size of a cross section of the light exit area 400 of the plurality of light emitting diodes 200 parallel to the base substrate 207 is less than or equal to the size of a cross section of the plurality of polarization layers 300 parallel to the base substrate 207, so as to ensure the light emitted from the light exit area 400 of the light emitting diodes 200 through the polarization layers 300 to become the polarization light. Because each of the plurality of polarization layers 300 and the first electrode 201 are disposed on the same layer, the size of the cross section of the polarization layers 300 parallel to the base substrate 207 is less than the size of the cross section of the plurality of light emitting diodes 200 parallel to the base substrate 207, and the first electrode 201 is an opaque conductive electrode. The present embodiment is not limited thereto, for example, the first electrode 201 is a transparent conductive electrode, the plurality of polarization layers 300 include a portion located on the first electrode 201 in addition to the portion in the same layer as the first electrode 201, that is, the first electrode 201 can be located in the light exit area 400 of the plurality of light emitting diodes 200. For example, the plurality of light emitting diodes 200 can also share the first electrode 201, at this moment, the first electrode 201 is an integral electrode, the first electrode 201 can be a transparent conductive electrode, and each of the plurality of polarization layers 300 is located on the first electrode 201 of the light exit area 400.

For example, a material of the plurality of polarization layers 300 includes a metal or a resin containing a conductive substance, for example, the material can include molybdenum, aluminum, chromium, copper, silver, or the like; the material can also be a resin layer containing a conductive substance, the conductive substance can be a nano-sized metal wire, which including silver wire, aluminum wire and so on, or a metal powder-like additive or the like. The material of the plurality of polarization layers 300 is not limited in the present embodiment, the material can also be a nano-sized transparent or opaque non-conductive material.

For example, the plurality of polarization layers 300 have a nano-sized grating pattern and can be fabricated by methods such as nanoimprint or laser direct structuring, the present embodiment is not limited thereto. For example, a period of the grating pattern of the plurality of polarization layers 300 can be 60 nm-300 nm. For example, the grating pattern of the plurality of polarization layers 300 is parallel slits, for example a metal wire grating polarization structure. The metal wire grating polarization structure utilizes the oscillation characteristic of free electrons on the metal surface to make transverse electric (TE) polarization light with the electric field direction parallel to the wire grating direction excite the electrons to oscillate in the wire grating direction so as to reflect; however, transverse magnetic (TM) polarization light with electric field direction perpendicular to the wire grating direction cannot excite the free electrons to oscillate due to the periodic structure restriction, and thus the TM polarization light mainly shows a transmission characteristic, that is, the light component with the electric field direction parallel to the wire grating is almost totally reflected by the metal wire grating polarization structure, in turn, most of the light with the electric field direction perpendicular to the wire grating can pass through the metal wire grating polarization structure.

For example, the size of each of the plurality of light emitting diodes 200 is several microns to dozens of micron, for example, the size of each of the plurality of light emitting diodes 200 is 1 μm to 100 μm, that is, the plurality of light emitting diodes 200 are micron light emitting diodes, the present embodiment is not limited thereto.

For example, every two adjacent light emitting diodes 200 of the plurality of light emitting diodes 200 are spaced apart, that is, the polarization layers 300 on the light exit side of every two adjacent light emitting diodes 200 are spaced apart.

Second Embodiment

Different from the first embodiment, the plurality of light emitting diodes provided by the present embodiment include a plurality of light emitting diode groups, each of the light emitting diode groups includes at least two light emitting diodes of different colors, therefore, the light emitting diodes can realize the colored 3D display effect.

Figure 4:
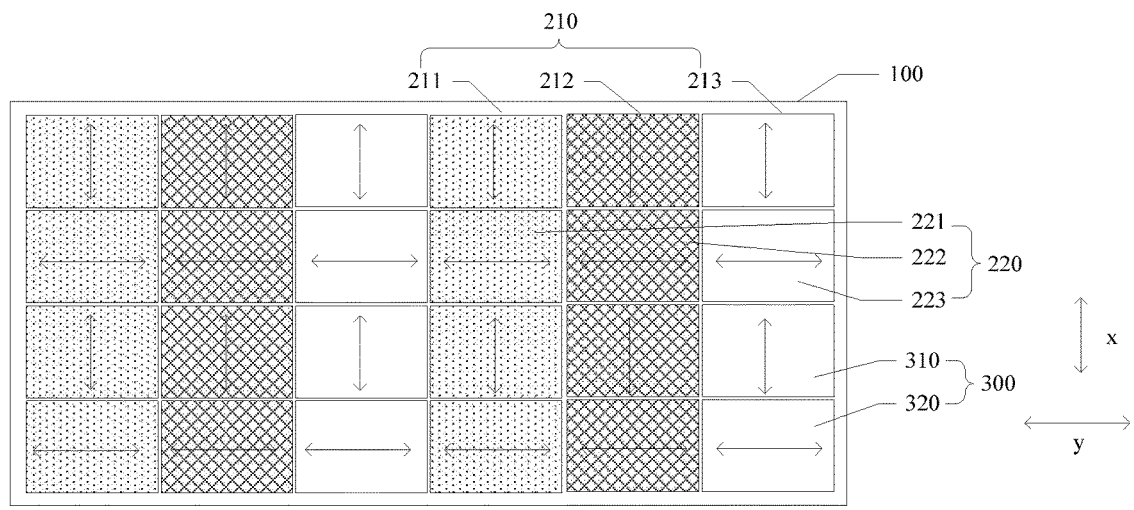
FIG. 4 is a view of a light emitting diode display panel provided by another embodiment of the present disclosure.

FIG. 4 is a view of a light emitting diode display panel provided by the present embodiment, as illustrated in FIG. 4, the plurality of light emitting diodes 200 include a plurality of light emitting diode groups, for example, the plurality of light emitting diodes 200 include light emitting diode groups 210 and 220. The light emitting diode group 210 includes the light emitting diodes 221, 222 and 223 of three different colors, and the plurality of polarization layers 300 on the light exit side of each of the light emitting diodes in each of the light emitting diode groups have the same polarization direction. For example, as illustrated in FIG. 4, the plurality of polarization layers 300 on the light exit side of the plurality of light emitting diode groups arranged in the first direction have the same polarization direction, the first polarization layers 310 and the second polarization layers 320 on the light exit side of the plurality of light emitting diode groups arranged in a second direction perpendicular to the first direction are alternately arranged, it should be noted that, the first direction in the present embodiment refers to the y direction in FIG. 4, the second direction refers to the x direction, however, the present embodiment is not limited thereto. For example, the light emitting diode group 210 includes a red light emitting diode 211, a green light emitting diode 212 and a blue light emitting diode 213, and the plurality of first polarization layers 310 on the light exit side of the light emitting diodes of the three colors have the polarization direction along the x direction. The light emitting diode group 220 includes a red light emitting diode 221, a green light emitting diode 222 and a blue light emitting diode 223, and the plurality of second polarization layers 320 on the light exit side of the light emitting diodes of the three colors have the polarization along the y direction, the present embodiment is described by taking a case that the x direction is perpendicular to the y direction, but is not limited thereto. For example, the plurality of first polarization layers 310 and the plurality of second polarization layers 320 are circular polarization layers, and rotations of the two are opposite. For example, each of the plurality of light emitting diode groups can form a pixel for color display.

Figure 5:
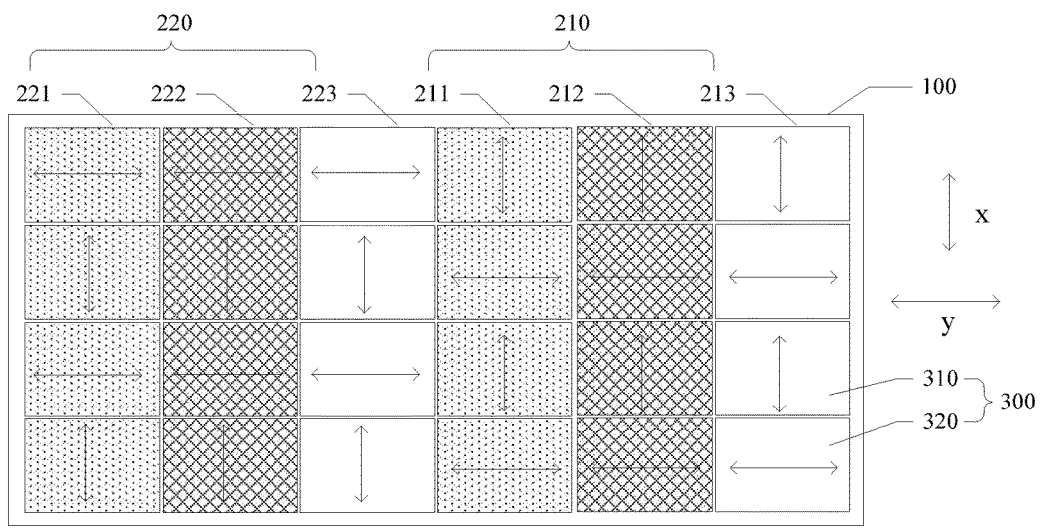
FIG. 5 is a view of another light emitting diode display panel provided by another embodiment of the present disclosure.

FIG. 5 is a view of another light emitting diode display panel provided by the present embodiment, as illustrated in FIG. 5, the first polarization layers 310 and the second polarization layers 320 are respectively disposed on the light exit side of every two adjacent light emitting diode groups, for example, the light emitting diode groups 210 includes a red light emitting diode 211, a green light emitting diode 212 and a blue light emitting diode 213, and the first polarization layers 310 which are located on the light exit side of the light emitting diodes of the three colors; the light emitting diode group 220 includes a red light emitting diode 221, a green light emitting diode 222 and a blue light emitting diode 223, and the second polarization layers 320 which are located on the light exit side of the light emitting diodes of the three colors. The present embodiment is described by taking a case that the light emitting diode group 210 and the light emitting diode group 220 are alternately arranged in the x direction and the y direction, but is not limited thereto.

For example, the driving device is used to respectively control the plurality of light emitting diode groups with the plurality of first polarization layers 310 and the plurality of second polarization layers 320 on the light exit side to display two different images so that the human eye can see two different images in a case that the polarization images emitted from the plurality of first polarization layers 310 and the plurality of second polarization layers 320 through the corresponding polarization glasses, thereby realizing the colored 3D display effect. The light emitting diode display panel can be used to realize the polarization display images in a line-by-line/column-by-column or a one-to one manner, so as to reduce the chance of the crosstalk caused by the light emitted by each of the plurality of light emitting diode groups enter into the polarization area corresponding to the adjacent light emitting diode groups and solve 3D crosstalk and other problems, thereby enhancing the 3D experience effect.

Third Embodiment

Figure 6:
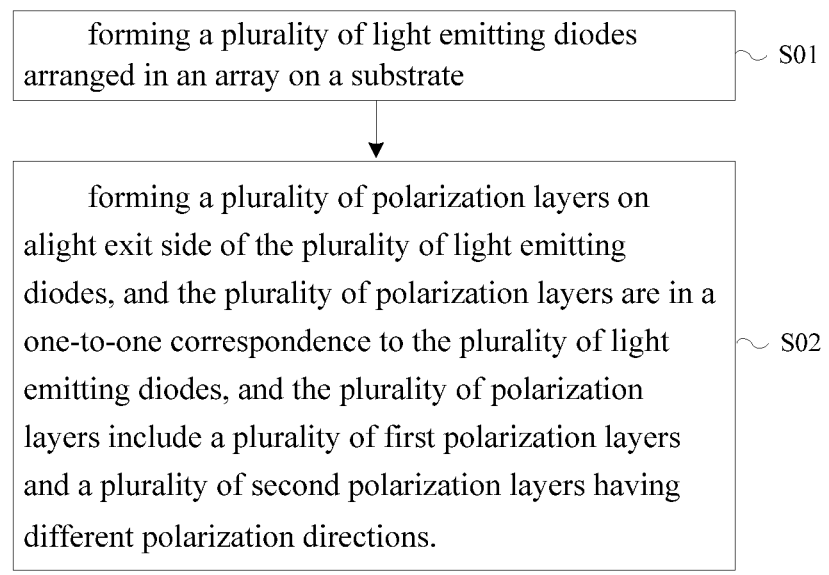
FIG. 6 is a view of a manufacturing method of a light emitting diode display panel provided by an embodiment of the present disclosure.

The present embodiment provides a manufacturing method of a light emitting diode display panel, as illustrated in FIG. 6, the manufacturing method of the light emitting diode display panel includes:

S01: forming a plurality of light emitting diodes arranged in an array on a substrate;

S01: forming a plurality of polarization layers on a light exit side of the plurality of light emitting diodes, and the plurality of polarization layers are in a one-to-one correspondence to the plurality of light emitting diodes, and the plurality of polarization layers include a plurality of first polarization layers and a plurality of second polarization layers having different polarization directions.

A light emitting diode display panel manufactured by the manufacturing method of the light emitting diode display panel can be used to form different polarization display images in a line-by-line/column-by column or a one-by-one manner, the left and right eyes of the human eyes can see different images in a case that the polarization display images pass through the corresponding glasses so as to realize a monochrome or colored 3D display effect. The light emitting diode display panel manufactured by the manufacturing method of the light emitting diode display panel can be used to solve 3D crosstalk and other problems, thereby enhancing the 3D experience effect.

For example, forming each of the plurality of light emitting diodes including forming a second semiconductor layer on a base substrate; forming a second electrode and a light emitting layer on the second semiconductor layer, for example, the second electrode and the light emitting layer can be spaced apart; forming a first semiconductor layer on the light emitting layer; forming a current spreading layer on the first semiconductor layer; forming a first electrode on the current spreading layer. The present embodiment is not limited thereto, for example, each of the plurality of light emitting diodes provided by the present embodiment may not include the current spreading layer. For example, each of the plurality of light emitting diodes provided by the present embodiment can further include a current blocking layer, a middle barrier layer, a buffer layer and so on.

For example, the first electrode is formed on the light exit side of each of the plurality of light emitting diodes, the present embodiment is described by taking a case that the light exit side of the light emitting diodes is a side thereof away from the base substrate, the present embodiment is not limited thereto.

For example, the plurality of light emitting diodes provided by the present embodiment are micro light emitting diodes. For example, forming the plurality of light emitting diodes arranged in an array on the substrate in the manufacturing method of the light emitting diode display panel provided by the present embodiment including: transferring the plurality of light emitting diodes onto the substrate by a transferring method. For example, a specific preparation process of transferring the plurality of light emitting diodes is: separating a light emitting diode chip from a sapphire-based substrate by laser lift-off technique, absorbing the light emitting diode chip from the sapphire-based substrate by a patterned polydimethylsiloxane (PDMS) transmission head, aligning the PDMS transmission head with a receiver substrate, adhering the light emitting diode ship absorbed by the PDMS transmission head to a preset position of the receiver substrate, and then stripping the PDMS transmission head, and the light emitting diode chip can be transferred to the receiver substrate so as to manufacture the light emitting diode display panel.

For example, forming the plurality of polarization layers on the light exit side of the plurality light emitting diodes including: after transferring the plurality of light emitting diodes onto the substrate, forming the plurality of polarization layers on a same layer as the layer of the first electrode.

For example, an orthogonal projection of light exit area of the plurality of light emitting diodes on the substrate falls within an orthogonal projection of the plurality of polarization layers on the substrate, and the orthogonal projection of the plurality of polarization layers on the substrate falls within an orthogonal projection of the plurality of light emitting diodes on the substrate. That is, the size of a cross section of the light exit area of the plurality of light emitting diodes parallel to the substrate is less than or equal to the size of a cross section of the plurality of polarization layers parallel to the substrate, so as to ensure the light emitted from the light exit area of the plurality of light emitting diodes pass through the plurality of polarization layers to become the polarization light. Because each of the plurality of polarization layers and the first electrode are disposed on the same layer, the size of the cross section of the plurality of polarization layers parallel to the substrate is less than the size of the cross section of the plurality of light emitting diodes parallel to the substrate, and the first electrode is an opaque conductive electrode. The present embodiment is not limited thereto, for example, the first electrode is a transparent conductive electrode, the plurality of polarization layers include a portion located on the first electrode in addition to the portion in the same layer as the first electrode, that is, the first electrode can be located in the light exit area of each of the plurality of light emitting diodes.

For example, the plurality of polarization layers with the same polarization directions are formed on the light exit side of the plurality of light emitting diodes arranged in a first direction, a plurality of first polarization layers and a plurality of second polarization layers are alternately arranged on the plurality of light emitting diodes arranged in a second direction perpendicular to the first direction. Therefore, the light emitting diode display panel made by the manufacturing method can form different polarization display images in a line-by-line/column-by-column manner, the left and right eyes of the human eyes can see different images in a case that the polarization display image light passes through the corresponding polarization glasses so as to realize the monochrome 3D display effect.

For example, a first polarization layers and a second polarization layers are respectively formed on the light exit side of every two adjacent light emitting diodes. Therefore, the light emitting diode display panel made by the manufacturing method can form different polarization display images in a one-by-one manner, the left and right eyes of the human eyes can see different images in a case that the polarization display image light passes through the corresponding polarization glasses so as to realize the monochrome 3D display effect. The light emitting diodes fabricated by the manufacturing method of the light emitting diode display panel can be used to reduce the chance of crosstalk caused by the light emitted by each of the light emitting diodes enter into the polarization area corresponding to the adjacent light emitting diodes, so as to solve the 3D crosstalk and other problems, thereby enhance the 3D experience effect.

For example, the plurality of light emitting diodes include a plurality of light emitting diode groups, each of the plurality of light emitting diode groups includes at least two light emitting diodes of different colors, and the polarization layers disposed on the light exit side of each of the light emitting diodes in each of the light emitting diode groups have the same polarization direction. For example, each of the light emitting diode groups includes a red light emitting diode, a green light emitting diode, a blue light emitting diode, the present embodiment is not limited thereto. For example, each of the light emitting diode groups can form a pixel for color 3D display, the present embodiment is not limited thereto.

For example, in the present embodiment, each of the plurality of polarization layers disposed as the same layer as the first electrode can emit the polarization light without the need of an external polarization structure, so as to reduce the monolithic thickness and volume of the plurality of light emitting diodes and optimize the performance.

For example, the plurality of polarization layers are formed by a nano-imprint method. For example, the nano-imprint technology includes transferring a pattern to a corresponding substrate though a template, a transfer medium is usually a thin layer of polymer film, the structure of the transfer medium can be harden by hot pressing or irradiation and other methods to retain a transferred pattern. The nano-imprint template is made in advance according to a grating pattern including slits arranged in parallel required for polarization, the template can be made of quartz, glass or plastic. The present embodiment is not limited to the nano-imprint method, and can also use laser direct structuring techniques and other methods. For example, the thickness of the polarization layers formed by nano-imprint can be very thin, for example, the plurality of polarization layers can have a thickness of 50 Å-200 Å, the present embodiment is not limited thereto. Therefore, the monolithic thickness and volume of the plurality of light emitting diodes can be reduced and the performance can be optimized.

Fourth Embodiment

The present embodiment provides a display device, which includes the light emitting diode display panel as mentioned above, the display device can form different polarization display images in a line-by-line/column-by-column or a one-by-one manner, the left and right eyes of the human eyes can see different images in a case that the polarization image light passes through the corresponding polarization glasses so as to realize a monochrome or colored 3D display effect. The display device can further be used to solve 3D crosstalk and other problems, thereby enhancing the 3D experience effect. Furthermore, each of the plurality of polarization layers formed on the same layer of the first electrode located on the light exit side can reduce the monolithic thickness and volume of the display device, thereby optimizing the performance.

For example, the display device can be a light emitting diode display device, for example, the display device can be a micro light emitting diode display device and so on, the present embodiment is not limited thereto.

The following statements should be noted:

(1) Unless otherwise defined, the same reference numerals in at least one embodiment and the drawings of the present disclosure represent the same meaning.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

The foregoing is only the embodiments of the present invention and not intended to limit the scope of protection of the present invention. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A light emitting diode display panel, comprising:
a substrate;
a plurality of light emitting diodes arranged in an array on the substrate;
a plurality of polarization layers, located on a light exit side of the plurality of light emitting diodes respectively, and the plurality of polarization layers are in a one-to-one correspondence to the plurality of light emitting diodes;
wherein the plurality of polarization layers comprise a plurality of first polarization layers and a plurality of second polarization layers having different polarization directions.

2. The light emitting diode display panel according to claim 1, wherein the plurality of first polarization layers and the plurality of second polarization layers are linear polarization layers, and the polarization direction of the plurality of first polarization layers is perpendicular to that of the plurality of the second polarization layers.

3. The light emitting diode display panel according to claim 1, wherein the plurality of first polarization layers and the plurality of second polarization layers are circular polarization layers, and a rotation of the plurality of first polarization layers is opposite to that of the plurality of second polarization layers.

4. The light emitting diode display panel according to claim 1, wherein the plurality of polarization layers on the light exit side of the plurality of light emitting diodes arranged in a first direction has the same polarization direction, the plurality of first polarization layers and the plurality of second polarization layers on the light exit side of the plurality of light emitting diodes arranged in a second direction perpendicular to the first direction are alternately arranged.

5. The light emitting diode display panel according to claim 1, wherein each of the plurality of first polarization layers and each of the plurality of second polarization layers are respectively located on the light exit side of every two adjacent light emitting diodes of the plurality of light emitting diodes.

6. The light emitting diode display panel according to claim 1, wherein each of the plurality of light emitting diodes comprises a first electrode, the first electrodes is located on the light exit side of each of the plurality of light emitting diodes, and the first electrode and each of the plurality of polarization layers are located on the same layer.

7. The light emitting diode display panel according to claim 1, wherein an orthogonal projection of an light exit area of the plurality of light emitting diodes on the substrate falls within an orthogonal projection of the plurality of polarization layers on the substrate, and the orthogonal projection of the plurality of polarization layers on the substrate falls within an orthogonal projection of the plurality of light emitting diodes on the substrate.

8. The light emitting diode display panel according to claim 1, wherein every two adjacent light emitting diodes of the plurality of light emitting diodes are spaced apart.

9. The light emitting diode display panel according to claim 1, wherein the plurality of light emitting diodes comprise a plurality of light emitting diode groups, each of the plurality of light emitting diode groups comprises at least two light emitting diodes of different colors, and the polarization layers located on the light exit side of the light emitting diodes in each of the plurality of light emitting diode groups have the same polarization direction.

10. The light emitting diode display panel according to claim 1, wherein each of the plurality of light emitting diodes has a size of about 1μm to 100 μm.

11. The light emitting diode display panel according to claim 1, wherein the plurality of polarization layers are provided with nano-sized grating patterns.

12. A manufacturing method of a light emitting diode display pane!, comprising:
   forming a plurality of light emitting diodes arranged in an array on a substrate;
   forming a plurality of polarization layers on a light exit side of the plurality of light emitting diodes, and the plurality of polarization layers are in a one-to-one correspondence to the plurality of light emitting diodes,
   wherein the plurality of polarization layers comprise a plurality of first polarization layers and a plurality of second polarization layers having different polarization directions.

13. The manufacturing method of the light emitting diode display panel according to claim 12, wherein forming the plurality of light emitting diodes comprising: forming a first electrode on the light exit side of each of the plurality of light emitting diodes.

14. The manufacturing method of the light emitting diode display panel according to claim 13, wherein forming the plurality of light emitting diodes arranged in an array on the substrate comprising;
   transferring the plurality of light emitting diodes onto the substrate by a transferring method;
   forming the plurality of polarization layers on the light exit side of the plurality light emitting diodes comprising: after transferring the plurality of light emitting diodes onto the substrate, forming the plurality of polarization layers on a same layer as the layer of the first electrode.

15. The manufacturing method of the light emitting diodes according to claim 12, wherein an orthogonal projection of light exit area of the plurality of light emitting diodes on the substrate falls within an orthogonal projection of the plurality of polarization layers on the substrate, and the orthogonal projection of the plurality of polarization layers on the substrate falls within an orthogonal projection of the plurality of light emitting diodes on the substrate.

16. A display device, comprising the light emitting diode display panel according to claim 1.

* * * * *